(12) United States Patent
Tamura

(10) Patent No.: US 9,019,711 B2
(45) Date of Patent: Apr. 28, 2015

(54) ELECTRONIC DEVICE AND CONNECTION STRUCTURE FOR CIRCUIT BOARD

(75) Inventor: Akira Tamura, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 158 days.

(21) Appl. No.: 13/419,064

(22) Filed: Mar. 13, 2012

(65) Prior Publication Data

US 2012/0236521 A1  Sep. 20, 2012

(30) Foreign Application Priority Data

Mar. 15, 2011  (JP) .................................. 2011-057108

(51) Int. Cl.
| H05K 5/00 | (2006.01) |
| H05K 1/00 | (2006.01) |
| H01R 12/00 | (2006.01) |
| H01R 13/62 | (2006.01) |
| H01R 12/71 | (2011.01) |
| H05K 7/14 | (2006.01) |

(52) U.S. Cl.
CPC ................ *H01R 13/62* (2013.01); *H01R 12/71* (2013.01); *H05K 7/1402* (2013.01); *H05K 7/1418* (2013.01)

(58) Field of Classification Search
USPC .................. 361/728–751, 752–759, 803–804, 361/805–837
See application file for complete search history.

(56) References Cited

U.S. PATENT DOCUMENTS

| 5,559,317 | A | * | 9/1996 | Wong et al. ................... 235/449 |
| 5,644,470 | A | | 7/1997 | Benedict et al. |
| 6,059,592 | A | * | 5/2000 | Inadama ........................ 439/188 |
| 6,399,906 | B1 | * | 6/2002 | Sato et al. ................... 200/61.59 |
| 6,411,517 | B1 | | 6/2002 | Babin |
| 6,457,647 | B1 | * | 10/2002 | Kurihashi et al. ............. 235/486 |
| 6,503,092 | B1 | * | 1/2003 | Sato ............................... 439/159 |
| 6,721,172 | B2 | * | 4/2004 | Katagiri et al. ................ 361/727 |
| 6,912,132 | B2 | * | 6/2005 | Riddiford et al. ............. 361/727 |

(Continued)

FOREIGN PATENT DOCUMENTS

| EP | 2 227 077 A2 | 9/2010 |
| JP | 1975-119282 | 9/1975 |

(Continued)

OTHER PUBLICATIONS

Office Action mailed May 20, 2014, issued in corresponding JP Patent Application No. 2011-057108 (with partial English translation).

(Continued)

*Primary Examiner* — Hoa C Nguyen
*Assistant Examiner* — Xanthia C Cunningham
(74) *Attorney, Agent, or Firm* — Squire Patton Boggs (US) LLP

(57) ABSTRACT

There is provided an electronic device that includes a housing including six sides at right angles to each other, a first side of the six sides including an opening, a first backplane arranged on a second side so as to oppose to the opening, a second backplane arranged on a third side adjacent to the second side, a circuit board which is inserted toward the first backplane through the opening to be coupled with both of the first backplane and the second backplane with use of a plurality of connectors, the circuit board including a specified corner, and a guide. The guide is configured to shift the circuit board toward the second backplane while the specified corner slides with contacting a portion of the guide which is arranged on a fourth side of the six sides opposed to the third side.

17 Claims, 11 Drawing Sheets

(56) References Cited

U.S. PATENT DOCUMENTS

| | | | |
|---|---|---|---|
| 6,940,727 B2* | 9/2005 | Dobbs et al. | 361/756 |
| 7,486,522 B2* | 2/2009 | Muller et al. | 361/737 |
| 8,199,511 B2* | 6/2012 | Kim et al. | 361/737 |
| 8,363,392 B2* | 1/2013 | Tanaka | 361/679.02 |
| 2003/0157839 A1* | 8/2003 | Yamaguchi et al. | 439/630 |
| 2004/0026507 A1* | 2/2004 | Nagata et al. | 235/449 |
| 2007/0218711 A1 | 9/2007 | Takahashi | |
| 2011/0164199 A1* | 7/2011 | Han et al. | 349/58 |

FOREIGN PATENT DOCUMENTS

| | | |
|---|---|---|
| JP | 2002-223085 A | 8/2002 |
| JP | 2006-024761 A | 1/2006 |
| JP | 2006-164627 A | 6/2006 |

OTHER PUBLICATIONS

Extended European Search Report dated Feb. 3, 2015, issued in corresponding EP Application No. 12159435.2.

* cited by examiner

ELECTRONIC DEVICE AND CONNECTION STRUCTURE FOR CIRCUIT BOARD

CROSS-REFERENCE TO RELATED APPLICATION

This application is based upon and claims the benefit of priority of the prior Japanese Patent Application No. 2011-057108, filed on Mar. 15, 2011, the entire contents of which are incorporated herein by reference.

FIELD

The embodiments discussed herein are related to an electronic device and a connection structure for circuit board.

BACKGROUND

In electronic devices such as servers and communication devices, daughter boards, which are circuit boards removably mounted in housings, have connectors concentrated at the front ends of the daughter boards in a direction in which the daughter boards are inserted. With this structure, since signal wires are routed through backplanes, which are boards disposed on surfaces of the housings toward which the daughter boards are inserted, the length of signal paths is increased. Also with this structure, the density of wiring on the daughter boards is increased, thereby increasing the number of daughter boards used in an electronic device and, accordingly, increasing the cost of the electronic devices.

In order to overcome these drawbacks, connectors are provided on a plurality of edges of the daughter board. When the daughter board has connectors on the plurality of edges thereof, the backplanes, which are boards on the housing side, are provided corresponding to the edges of the daughter board where the connectors are disposed.

When an electronic device has a plurality of backplanes connected to the plurality of edges of a daughter board as described above, the length of wiring on the daughter board from electronic components to the connectors may be decreased. This is useful for high-speed communication of a large number of signals. The above-described electronic device also allows the density of wiring on the daughter board to be decreased.

Specifically, the above-described connection structure uses a three-dimensional mounting structure in which backplanes are disposed on both side surfaces of the daughter board, or uses a structure in which a daughter board having been inserted into a housing is moved perpendicularly to the plane of the daughter board to connect the connectors on the backplane and the daughter board to each other. These connectors are disposed so as to be engageable in a direction perpendicular to the plane of the daughter board.

Japanese Laid-open Patent Publications No. 2006-164627, No. 50-119282, and No. 2002-223085 are examples of related art.

SUMMARY

According to an aspect of the invention, an electronic device includes a housing including six sides at right angles to each other, a first side of the six sides including an opening, a first backplane arranged on a second side of the six sides, the first backplane being arranged so as to oppose to the opening, a second backplane arranged on a third side of the six sides, the third side being adjacent to the second side, a circuit board which is inserted toward the first backplane through the opening to be coupled with both of the first backplane and the second backplane with use of a plurality of connectors, the circuit board including a specified corner, and a guide configured to shift the circuit board toward the second backplane while the specified corner slides with contacting a portion of the guide, the guide being arranged on a fourth side of the six sides, the fourth side being opposed to the third side.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preliminary Consideration

In the structure, described in the background, in which the backplanes are disposed on both sides of the daughter board, a specific engagement method is required to realize three-dimensional mounting. There is also a problem with the structure in which the daughter board is moved perpendicularly to the plane of the daughter board to connect the connectors of the backplanes and the daughter board to each other. With this structure, separate operations are required in order to align the connectors with each other for connection and to move the daughter board.

An embodiment of an electronic device and a connection structure for a circuit board according to the present invention will be described in detail below with reference to the drawings. The present embodiment does not limit the disclosed technology.

First Embodiment

Figure 1:
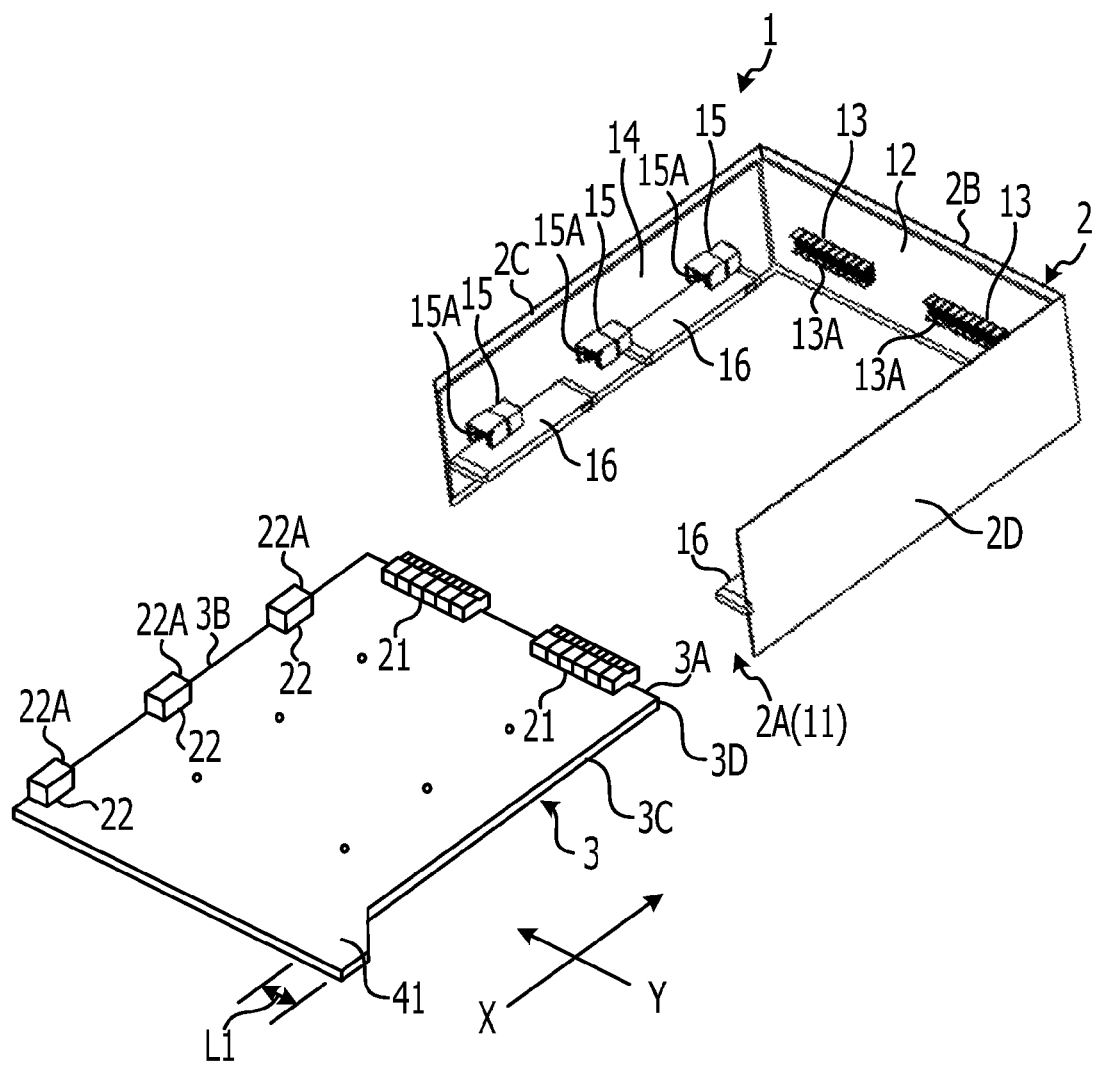
FIG. 1 is an exploded perspective view of an electronic device according to a first embodiment with part of the electronic device omitted.
Figure 2:
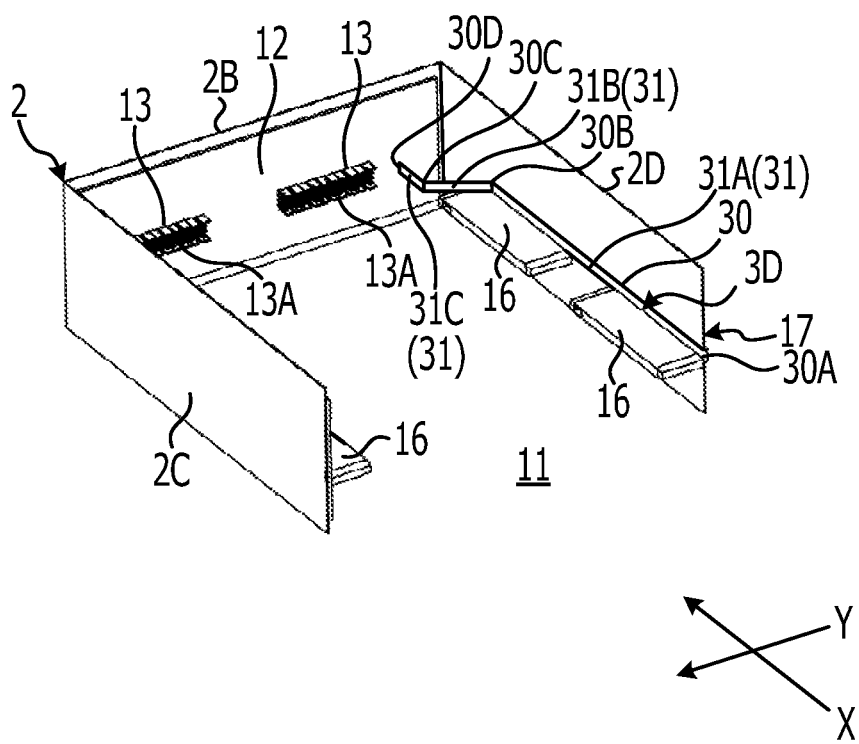
FIG. 2 is a perspective view of a housing of the electronic device according to the first embodiment with part of the housing omitted.

FIG. 1 is an exploded perspective view of an electronic device according to a first embodiment with part of the electronic device omitted. FIG. 2 is a perspective view of a housing of the electronic device according to the first embodiment with part of the housing omitted. An electronic device 1 illustrated in FIG. 1 includes a housing 2 and a daughter board 3 that is mounted in the housing 2. The housing 2 has a front portion 2A, a rear surface portion 2B, a first side surface portion 2C, a second side surface portion 2D, a top surface portion (not illustrated), and a bottom surface portion (not illustrated). The front portion 2A is defined by an opening portion 11. The rear surface portion 2B opposes the front portion 2A. The first side surface portion 2C is adjacent to the rear surface portion 2B. The second side surface portion 2D is adjacent to the rear surface portion 2B and opposes the first side surface portion 2C.

A first backplane 12 is disposed on the rear surface portion 2B. The first backplane 12 includes two first connectors 13 disposed thereon as an example. Each of the first connectors 13 is a straight connector having an engagement surface 13A on the front surface portion thereof. A second backplane 14 is disposed on the first side surface portion 2C. The second backplane 14 includes three second connectors 15 disposed thereon as an example. Each of the second connectors 15 is a right-angle connector having an engagement surface 15A on the side surface portion thereof.

The daughter board 3 includes two straight third connectors 21 disposed on a leading end area 3A side thereof. The third connectors 21 are engaged with the first connectors 13 of the first backplane 12. The daughter board 3 also includes three right-angle fourth connectors 22 disposed on a first side surface portion 3B side thereof. The fourth connectors 22 are engaged with the second connectors 15 of the second backplane 14.

The housing 2 has guide rails 16 disposed therein on the first side surface portion 2C and the second side surface portion 2D thereof. The guide rails 16 contact a lower surface of the daughter board 3 inserted through the opening portion 11, and hold the daughter board 3 such that the daughter board 3 is slidable relative to the guide rails 16. The guide rails 16 hold the daughter board 3 such that the daughter board 3 is perpendicular to the rear surface portion 2B, the first side surface portion 2C, and the second side surface portion 2D while the first connectors 13, the third connectors 21, the second connectors 15, and the fourth connectors 22 are horizontally disposed.

A guide mechanism 17 is provided on the second side surface portion 2D inside the housing 2. The guide mechanism 17 guides the daughter board 3 inserted through the opening portion 11 into the housing 2. The guide mechanism 17 contacts a side surface portion 3C of the daughter board 3 and guides the daughter board 3 held on the guide rails 16 in a direction in which the daughter board 3 is inserted into the housing 2. When this insertion direction is the X-direction, a horizontal direction of the plane of the daughter board 3 that is directed toward the first side surface portion 2C and perpendicular to the X-direction is the Y-direction.

The guide mechanism 17 has a guide groove member 30 that is provided on the second side surface portion 2D. The guide groove member 30 has a guide groove 31 formed therein. The second side surface portion 3C of the daughter board 3 inserted through the opening portion 11 contacts the guide groove 31 while sliding in the guide groove 31. The guide groove 31 guides the daughter board 3 from the start of insertion to the completion of mounting via following positions: a linear movement start position 30A, a parallel movement start position 30B, a parallel movement end position 30C, and a linear movement end position 30D.

A linear movement of the daughter board 3 in the X-direction in the guide groove 31 starts at the linear movement start position 30A when the daughter board 3 is slid. At the parallel movement start position 30B, the linear movement of the daughter board 3 in the X-direction started from the linear movement start position 30A is stopped, and parallel movement of the daughter board 3 in the guide groove 31 in a diagonal direction toward the first side surface portion 2C side starts. At the parallel movement end position 30C, the parallel movement of the daughter board 3 in a diagonal direction toward the first side surface portion 2C side is complete, and the linear movement of the daughter board 3 in the X-direction in the guide groove 31 restarts. At the linear movement end position 30D, the linear movement of the daughter board 3 in the X-direction in the guide groove 31 is complete.

The guide groove 31 includes a first guide groove 31A, a second guide groove 31B, and a third guide groove 31C. The second guide groove 31B is continuous with the first guide groove 31A, and the third guide groove 31C is continuous with the second guide groove 31B. The first guide groove 31A guides the daughter board 3 between the linear movement start position 30A and the parallel movement start position 30B.

The first guide groove 31A guides the daughter board 3 so as to prevent the fourth connectors 22 from interfering with the second connectors 15 in the linear movement in the X-direction. The second guide groove 31B guides the daughter board 3 between the parallel movement start position 30B and the parallel movement end position 30C. The second guide groove 31B makes the daughter board 3 sliding toward the first backplane 12 undergo the parallel movement in a sliding manner from the second side surface portion 2D toward the first side surface portion 2C. As a result, the daughter board 3 is guided to a position in which engagement surfaces 22A of the fourth connectors 22 to be engaged with the second connectors 15 oppose the engagement surfaces 15A of the second connectors 15. Likewise, the daughter board 3 is guided to a position in which engagement surfaces 21A of the third connectors 21 to be engaged with the first connectors 13 oppose the engagement surfaces 13A of the first connectors 13.

The third guide groove 31C guides the daughter board 3 between the parallel movement end position 30C and the linear movement end position 30D. The third guide groove 31C makes the daughter board 3 restart the linear movement in the X-direction. By doing this, the third connectors 21 are engaged with the first connectors 13, and the fourth connectors 22 are engaged with the second connectors 15. Thus, the daughter board 3 is guided by the first guide groove 31A, the second guide groove 31B, and the third guide groove 31C to be connected to the first side surface portion 2C and the first backplane 12 with a single operation. The distance between the parallel movement end position 30C to the linear movement end position 30D is equal to or greater than the moving distance of the third connectors 21 between a position at which engagement of the third connectors 21 with the first connectors 13 starts and a position at which the engagement of third connectors 21 with the first connectors 13 is complete.

The side surface portion 3C of the daughter board 3 has a protruding portion 41 that protrudes at a position in a rearward direction of the daughter board 3, for example, at a position spaced away from a leading end portion 3D by a distance equal to the distance between the linear movement start position 30A and the parallel movement start position 30B. When the leading end portion 3D of the side surface portion 3C of the daughter board 3 reaches the parallel movement start position 30B in the second guide groove 31B, the protruding portion 41 reaches the linear movement start position 30A in the first guide groove 31A. The protruding portion 41 assists the daughter board 3 in undergoing the parallel movement in a sliding manner toward the first side surface portion 2C side as the protruding portion 41 enters the first guide groove 31A. The protruding portion 41 protrudes from the surface of the side surface portion 3C by a dimension L1. L1 is equal to the distance of movement L2 in Y-direction, by which the daughter board 3 undergoes the parallel movement in the second guide groove 31B from the second side surface portion 2D side toward the first side surface portion 2C side (see FIG. 3A).

Figure 3A:
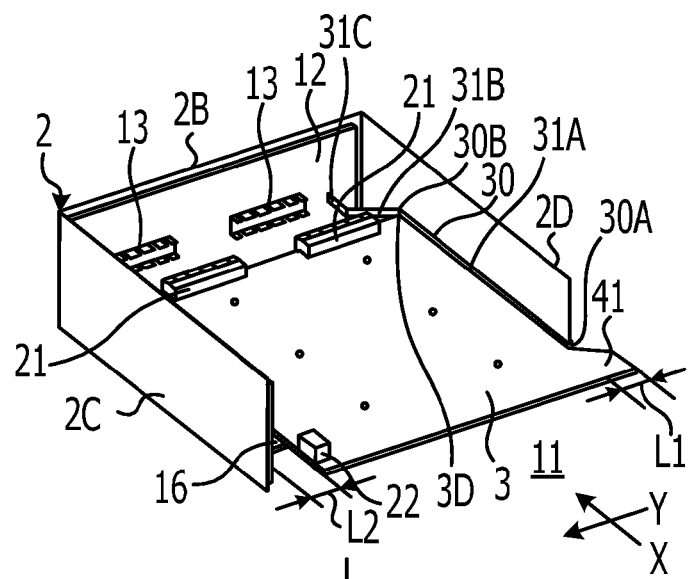
FIGS. 3A to 3E are explanatory diagrams illustrating an example of an assembly process of the electronic device according to the first embodiment.

Next, a method of assembling the electronic device 1 according to the first embodiment will be described. FIGS. 3A to 3E and FIGS. 4A to 4C are explanatory diagrams illustrating an example of an assembly process of the electronic device 1 according to the first embodiment. The daughter board 3 is inserted into the housing 2 through the opening portion 11. The daughter board 3 is guided into the housing 2 as illustrated in FIG. 3A while the side surface portion 3C of the daughter board 3 slides in the first guide groove 31A. The daughter board 3 is guided into the housing 2 in the X-direction through the first guide groove 31A. In so doing, the daughter board 3 is held on the guide rails 16 formed on the first side surface portion 2C and the second side surface portion 2D. As a result, the daughter board 3 is held perpendicularly to the first backplane 12 and the second backplane 14 while the first connectors 13, the third connectors 21, the second connectors 15, and the fourth connectors 22 are horizontally disposed.

Figure 3B:
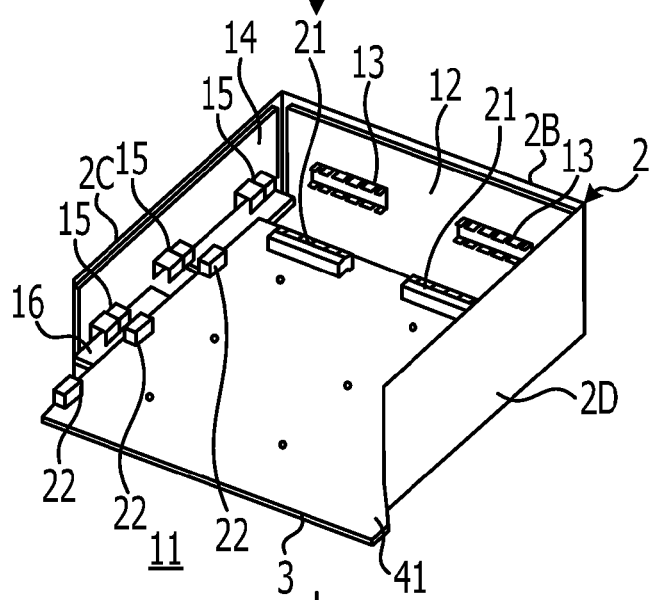
Figure 3C:
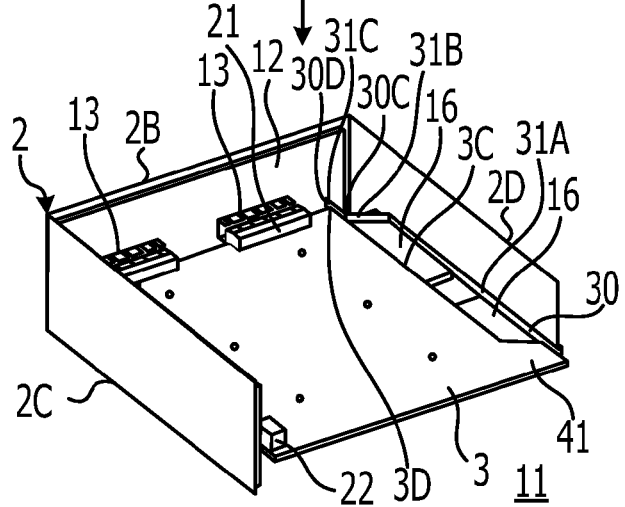
Figure 4A:
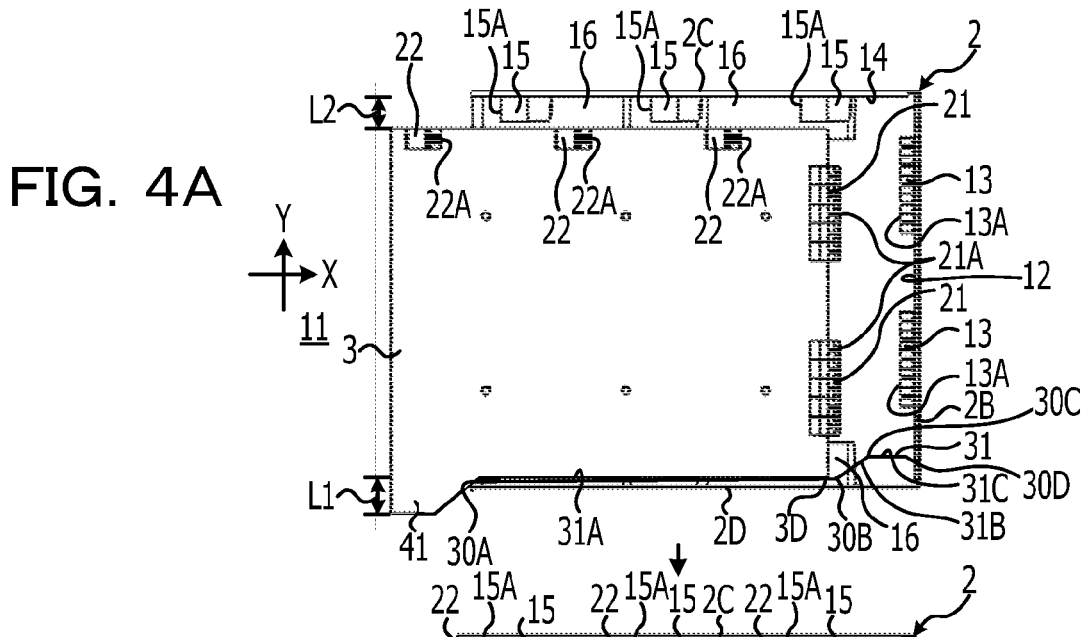
FIGS. 4A to 4C are explanatory diagrams illustrating the example of the assembly process of the electronic device according to the first embodiment.

As illustrated in FIGS. 3B and 4A, the daughter board 3 undergoes the linear movement in the X-direction on the guide rails 16 until the leading end portion 3D of the side surface portion 3C thereof reaches the parallel movement start position 30B through the first guide groove 31A. When the leading end portion 3D of the side surface portion 3C of the daughter board 3 reaches the parallel movement start position 30B, the protruding portion 41 located in a rearward direction of the daughter board 3 enters the first guide groove 31A. As illustrated in FIG. 3C, when the leading end portion 3D of the side surface portion 3C of the daughter board 3 moves beyond the parallel movement start position 30B and enters the second guide groove 31B, the parallel movement of the daughter board 3 starts in a diagonal direction toward the first side surface portion 2C side. As the protruding portion 41 enters the first guide groove 31A, the protruding portion 41 interferes with the first guide groove 31A. This interference assists the daughter board 3 in undergoing the parallel movement such that the daughter board 3 smoothly undergoes the parallel movement in a diagonal direction toward the first side surface portion 2C side.

Figure 3D:
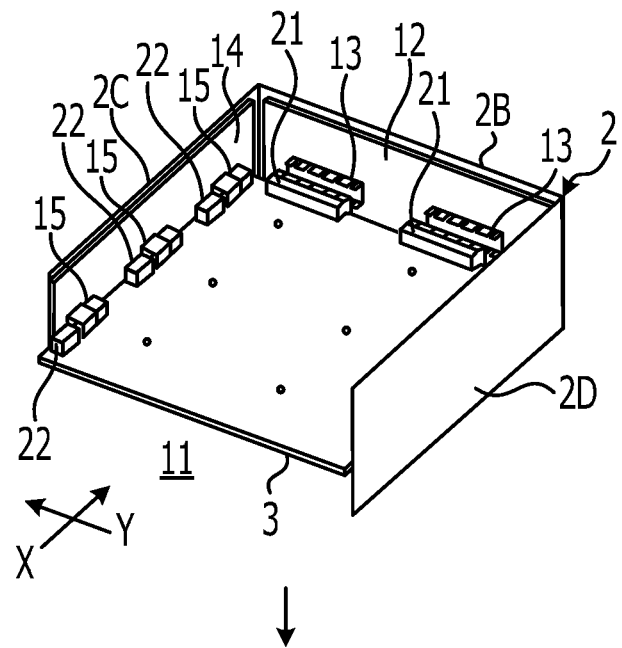
Figure 4B:
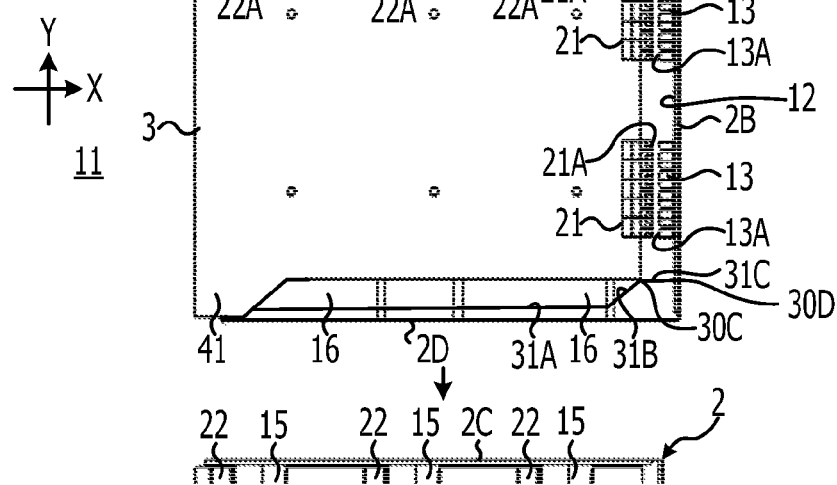

As illustrated in FIG. 3D, when the leading end portion 3D of the side surface portion 3C of the daughter board 3 reaches the parallel movement end position 30C in the second guide groove 31B, the parallel movement of the daughter board 3 in a diagonal direction toward the first side surface portion 2C side is complete. As a result, as illustrated in FIG. 4B, the daughter board 3 is guided to a position at which the engagement surfaces 21A of the third connectors 21 and the engagement surfaces 13A of the first connectors 13 oppose each other, and the engagement surfaces 22A of the fourth connectors 22 and the engagement surfaces 15A of the second connectors 15 oppose each other.

Figure 3E:
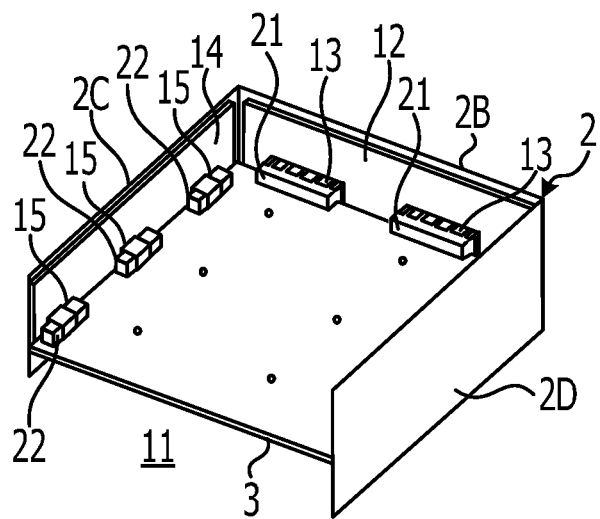
Figure 4C:
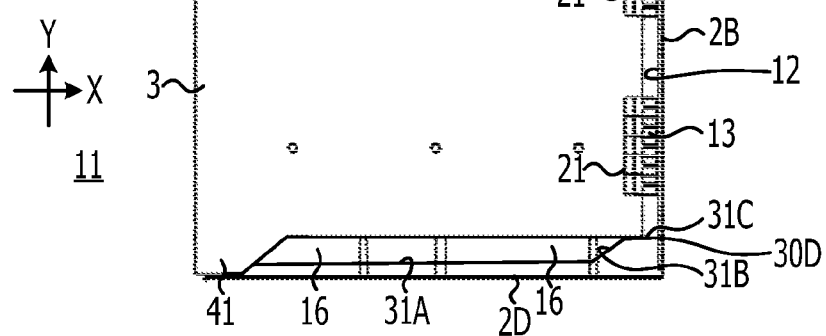

As illustrated in FIG. 3E, the leading end portion 3D of the side surface portion 3C of the daughter board 3 enters the third guide groove 31C and reaches the linear movement end position 30D as the daughter board 3 undergoes the linear movement in the X-direction. As illustrated in FIG. 4C, when the leading end portion 3D of the daughter board 3 reaches the linear movement end position 30D, the third connectors 21 are engaged with the first connectors 13, and the fourth connectors 22 are engaged with the second connectors 15. As a result, with a single insertion operation performed by a user, the daughter board 3 is mounted perpendicularly to the first backplane 12 and the second backplane 14.

In the first embodiment, with a single insertion operation, the daughter board 3 is guided through the guide groove 31 to a position at which the engagement surfaces 21A of the third connectors 21 and the engagement surfaces 13A of the first connectors 13 oppose each other, and the engagement surfaces 22A of the fourth connectors 22 and the engagement surfaces 15A of the second connectors 15 oppose each other. In the electronic device 1, the daughter board 3 is mounted perpendicularly to the first backplane 12 and the second backplane 14 by engaging the third connectors 21 with the first connectors 13 and engaging the fourth connectors 22 with the second connectors 15. As a result, in the first embodiment, a work burden in mounting the daughter board 3 in a direction perpendicular to the first backplane 12 and the second backplane 14 may be reduced. In addition, in the electronic device 1 according to the first embodiment, the non-uniform density of wiring on the daughter board 3 is suppressed. This allows the number of daughter boards 3 to be mounted to be decreased.

In the above-described first embodiment, the daughter board 3 is caused to undergo the parallel movement in a diagonal direction toward the first side surface portion 2C side through the guide groove 31 of the guide groove member 30. Alternatively, a guide protruding portion may be formed instead of the guide groove 31, and the daughter board 3 may have a guide recess portion in the side surface portion 3C thereof. In this case, the guide protruding portion slides in the guide recess portion so as to cause the daughter board 3 to undergo the parallel movement in a diagonal direction toward the first side surface portion 2C side.

Alternatively, in the above-described first embodiment, the guide mechanism 17 may use a guide surface that allows the side surface portion 3C of the daughter board 3 to slide along the guide surface so as to cause the daughter board 3 to undergo the parallel movement in a diagonal direction toward the first side surface portion 2C side without use of the guide groove 31 or the guide protruding portion.

In the above-described first embodiment, the guide groove member 30 having the guide groove 31 is disposed on the second side surface portion 2D. Instead, the guide groove 31 may be directly formed in the second side surface portion 2D.

In the above-described first embodiment, the protruding portion 41 formed on the side surface portion 3C of the daughter board 3 enters the first guide groove 31A so as to assist the parallel movement of the daughter board 3 as the protruding portion 41 interferes with the guide groove 31. Alternatively, formation of the protruding portion 41 may be omitted.

In the above-described first embodiment, the guide groove member 30 exemplifies the guide mechanism 17. Alternatively, a lever member may be pivotally disposed on the second side surface portion 2D instead of the guide groove member 30 so as to cause the daughter board 3 to undergo the parallel movement toward the first side surface portion 2C side. An embodiment in this case will be described below as a second embodiment.

Second Embodiment

Figure 5:
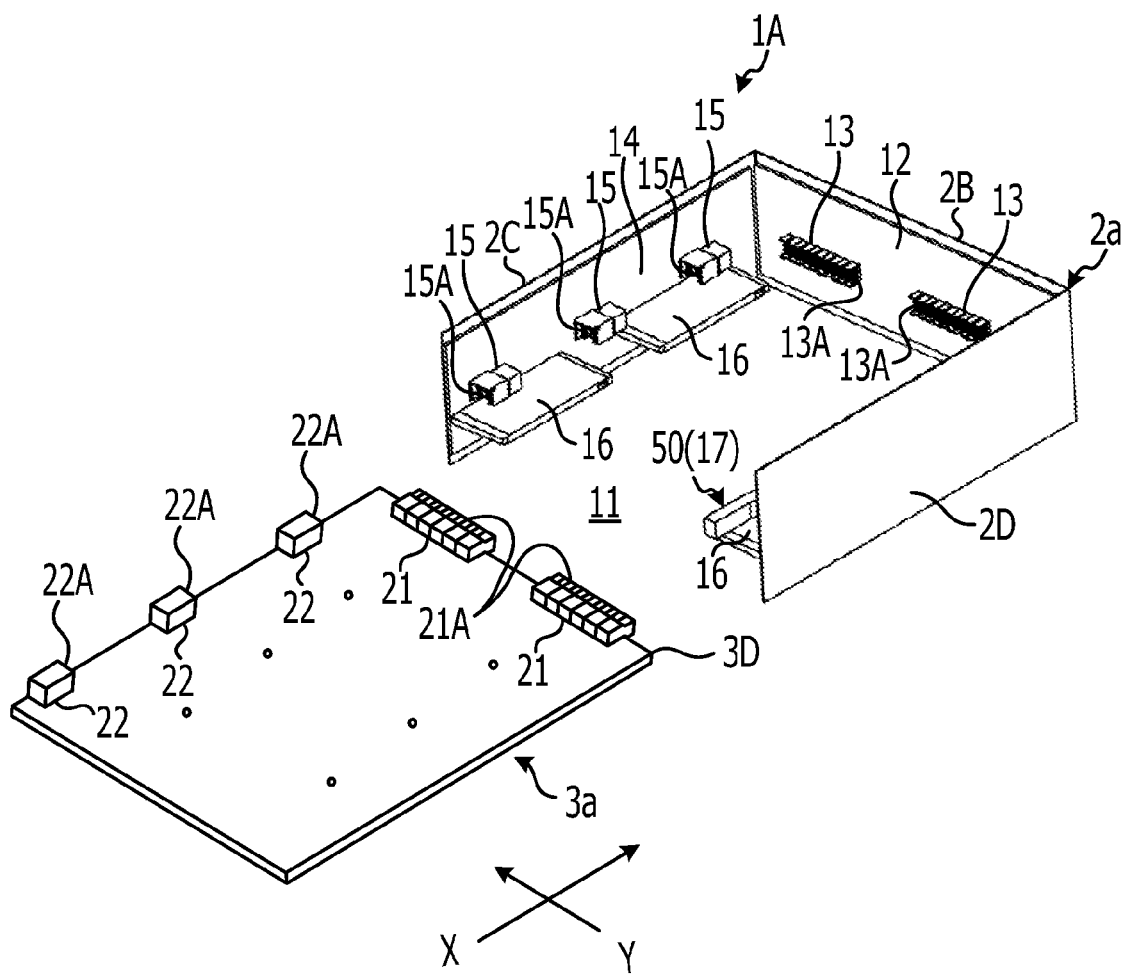
FIG. 5 is an exploded perspective view of an electronic device according to a second embodiment with part of the electronic device omitted.
Figure 6:
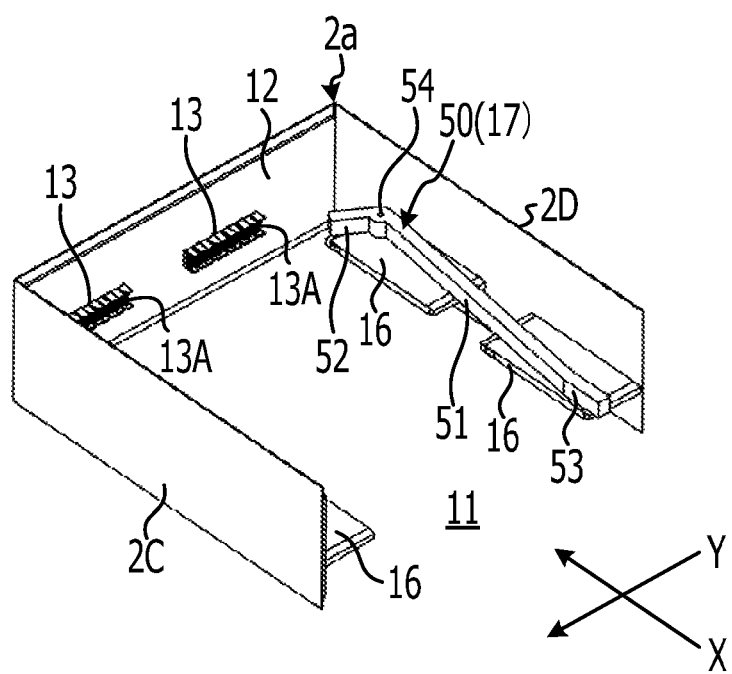
FIG. 6 is a perspective view of a housing of the electronic device according to the second embodiment with part of the housing of the electronic device omitted.

FIG. 5 is an exploded perspective view of an electronic device 1A according to a second embodiment with part of the electronic device 1A omitted. FIG. 6 is a perspective view of a housing 2a of the electronic device 1A according to the second embodiment with part of the housing 2a omitted. Components similar to those of the electronic device 1 according to the first embodiment are denoted by the same reference signs in order to omit duplicate descriptions of structures and operations thereof.

A main difference between the electronic device 1A illustrated in FIG. 5 and the electronic device 1 illustrated in FIG. 1 is that, in the electronic device 1A, the guide mechanism 17 provided on the second side surface portion 2D uses a lever member 50 instead of the guide groove member 30. The lever member 50 is pivotally disposed on one of the guide rails 16 formed on the second side surface portion 2D. The lever member 50 has a base member 51, a lever portion 52, a guide portion 53, and a fulcrum 54. The lever portion 52 is formed in a front end portion of the base member 51. The guide portion 53 is formed in a rear end portion of the base member 51. The lever portion 52 and the guide portion 53 are pivotable about the fulcrum 54.

The guide portion 53 of the lever member 50 guides a daughter board 3a in the X-direction into the housing 2a while allowing the side surface portion 3C of the daughter board 3a inserted through the opening portion 11 to slide along the guide portion 53. The daughter board 3a is disposed perpendicularly to the first backplane 12 and the second backplane 14 while the first connectors 13, the third connectors 21, the second connectors 15, and the fourth connectors 22 are horizontally disposed.

The lever portion 52 of the lever member 50 is pressed by the leading end portion 3D of the side surface portion 3C of the daughter board 3a in accordance with the linear movement in the X-direction of the daughter board 3a, which has been inserted from the opening portion 11. The lever portion 52 pivots about the fulcrum 54 toward the second side surface portion 2D side in accordance with a pressing operation performed by the leading end portion 3D. In addition, the guide portion 53 of the lever member 50 pivots about the fulcrum 54 toward the first side surface portion 2C side as the lever portion 52 pivots toward the second side surface portion 2D side. The guide portion 53 presses the side surface portion 3C of the daughter board 3a in a diagonal direction toward the first side surface portion 2C side as the guide portion 53 pivots toward the first side surface portion 2C side. As a result, in accordance with the pressing operation, the guide portion 53 causes the daughter board 3a to undergo a parallel movement to a position at which the engagement surfaces 21A of the third connectors 21 and the engagement surfaces 13A of the first connectors 13 oppose each other, and the engagement surfaces 22A of the fourth connectors 22 and the engagement surfaces 15A of the second connectors 15 oppose each other.

In addition, the lever portion 52 of the lever member 50 causes the daughter board 3a to undergo a parallel movement in a diagonal direction toward the first side surface portion 2C side in accordance with the pressing operation performed by the leading end portion 3D of the daughter board 3a. The lever portion 52 is brought out of contact with the leading end portion 3D of the daughter board 3a at a timing at which the parallel movement of the daughter board 3a toward the first side surface portion 2C side is complete. The daughter board 3a undergoes a linear movement in the X-direction into the housing 2a from a position at which the engagement surfaces 21A of the third connectors 21 and the engagement surfaces 13A of the first connectors 13 oppose each other, and the engagement surfaces 22A of the fourth connectors 22 and the engagement surfaces 15A of the second connectors 15 oppose each other. As a result, the daughter board 3a is mounted perpendicularly to the first backplane 12 and the second backplane 14 by engaging the third connectors 21 with the first connectors 13 and engaging the fourth connectors 22 with the second connectors 15.

Figure 7A:
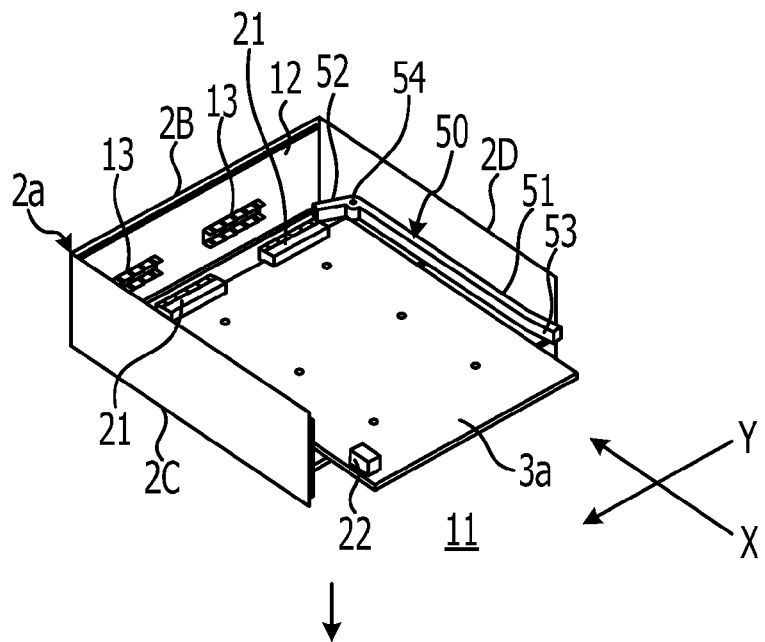
FIGS. 7A to 7E are explanatory diagrams illustrating an example of an assembly process of the electronic device according to the second embodiment.

Next, a method of assembling the electronic device 1A according to the second embodiment will be described. FIGS. 7A to 7E and FIGS. 8A to 8C are explanatory diagrams illustrating an example of an assembly process of the electronic device 1A according to the second embodiment. The daughter board 3a is inserted into the housing 2a by the user. The daughter board 3a is inserted into the housing 2a in the X-direction as illustrated in FIG. 7A while the side surface portion 3C thereof slides from the opening portion 11 along the lever member 50 on the second side surface portion 2D side. In so doing, the daughter board 3a is held on the guide rails 16 formed on the first side surface portion 2C and the second side surface portion 2D in the housing 2a. As a result, the daughter board 3a is held perpendicularly to the first backplane 12 and the second backplane 14 while the first connectors 13, the third connectors 21, the second connectors 15, and the fourth connectors 22 are horizontally disposed.

Figure 7B:
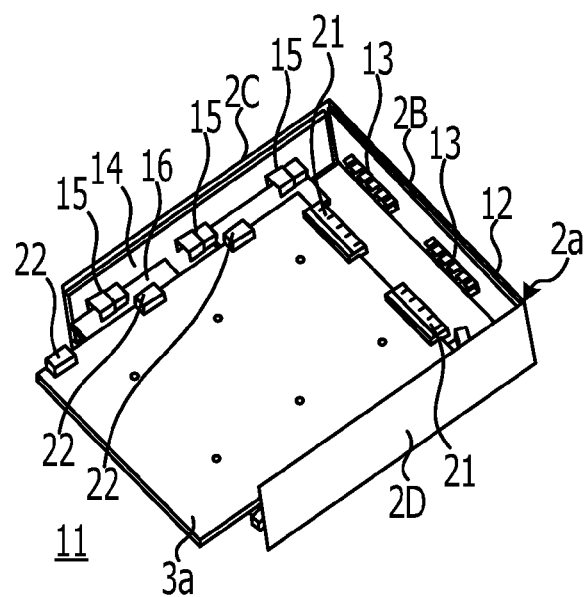
Figure 8A:
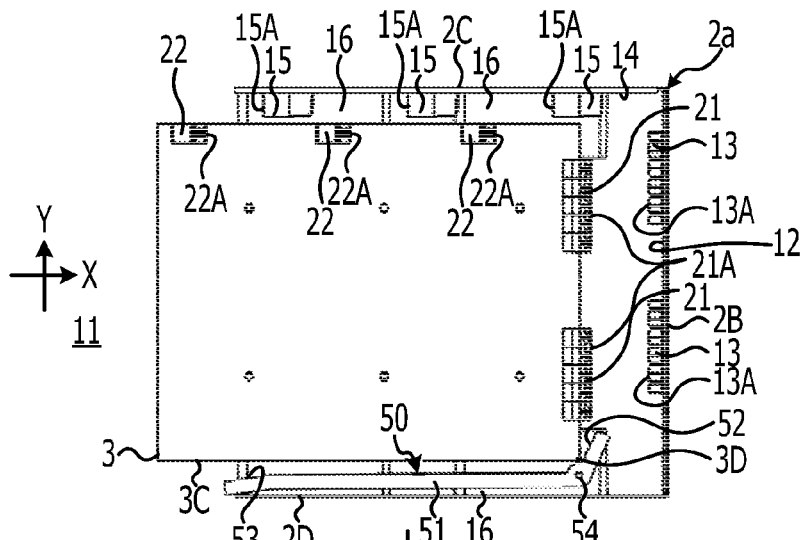
FIGS. 8A to 8C are explanatory diagrams illustrating the example of the assembly process of the electronic device according to the second embodiment.

When the daughter board 3a is inserted into the housing 2a in the X-direction, the daughter board 3a undergoes a linear movement in the X-direction on the guide rails 16 as illustrated in FIG. 7B. As illustrated in FIG. 8A, the leading end portion 3D of the side surface portion 3C of the daughter board 3a presses the lever portion 52 of the lever member 50 as the daughter board 3a undergoes the linear movement in the X-direction. The lever portion 52 of the lever member 50 pivots about the fulcrum 54 toward the second side surface portion 2D side in accordance with the pressing operation performed by the daughter board 3a. The guide portion 53 of the lever member 50 pivots toward the first side surface portion 2C side as the lever portion 52 undergoes the pivotal movement toward the second side surface portion 2D side.

Figure 7C:
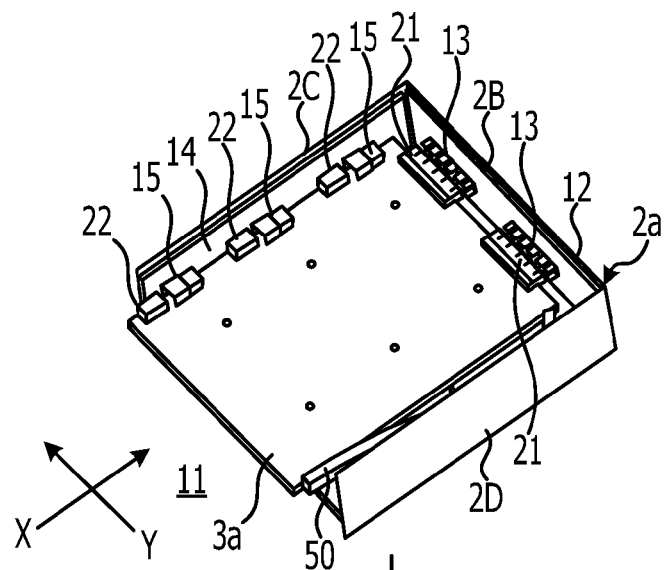
Figure 7D:
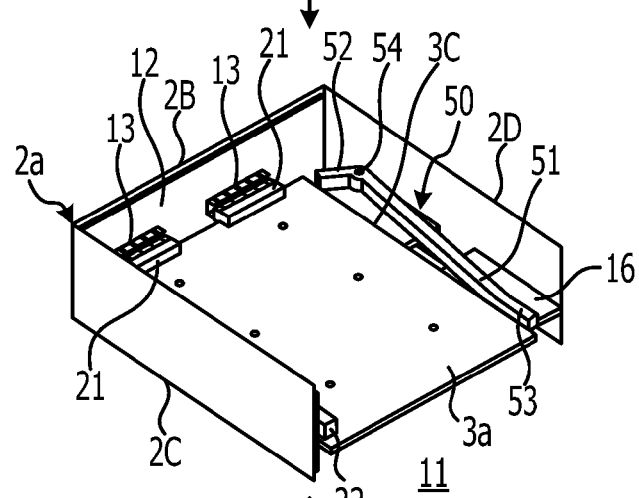
Figure 8B:
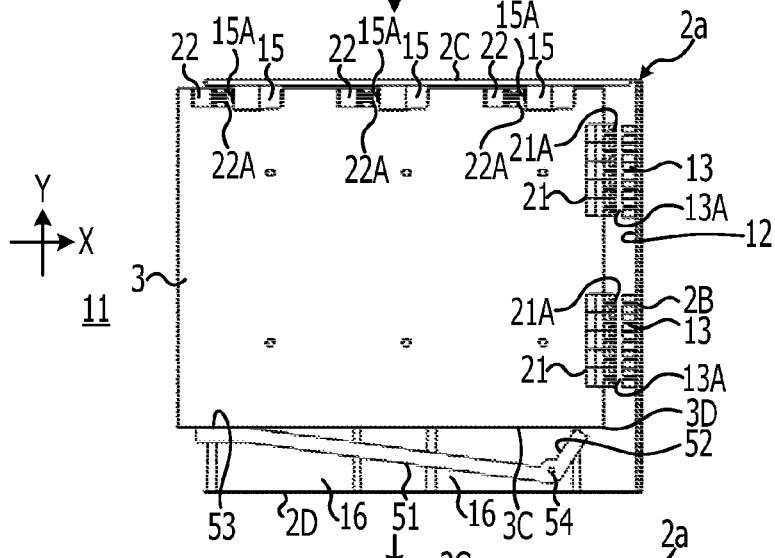

A rear end portion of the daughter board 3a starts the parallel movement in a diagonal direction toward the first side surface portion 2C in accordance with the pivotal movement of the guide portion 53 of the lever member 50 toward the first side surface portion 2C side. The lever portion 52 of the lever member 50 is brought out of contact with the leading end portion 3D of the daughter board 3a at a timing at which the parallel movement of the daughter board 3a toward the first side surface portion 2C side is complete as illustrated in FIGS. 7C and 7D. The lever portion 52 stops the pivotal movement toward the second side surface portion 2D side when the lever portion 52 is brought out of contact with the leading end portion 3D of the daughter board 3a. When the lever portion 52 stops the pivotal movement toward the second side surface portion 2D side, the guide portion 53 also stops the pivotal movement toward the first side surface portion 2C side. As a result, as illustrated in FIG. 8B, the daughter board 3a is guided to a position at which the engagement surfaces 21A of the third connectors 21 and the engagement surfaces 13A of the first connectors 13 oppose each other, and the engagement surfaces 22A of the fourth connectors 22 and the engagement surfaces 15A of the second connectors 15 oppose each other.

Figure 7E:
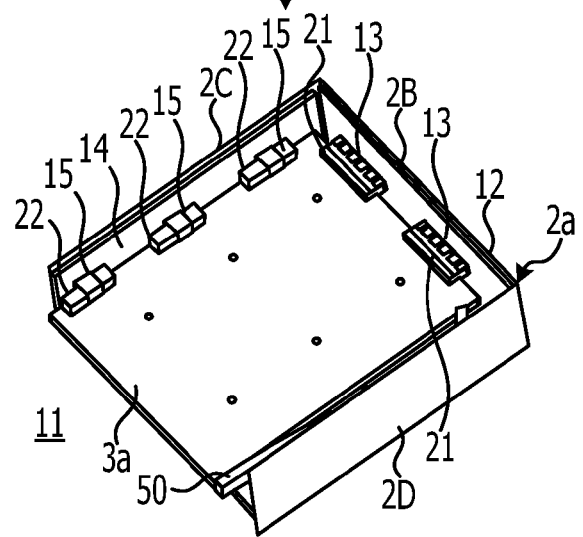
Figure 8C:
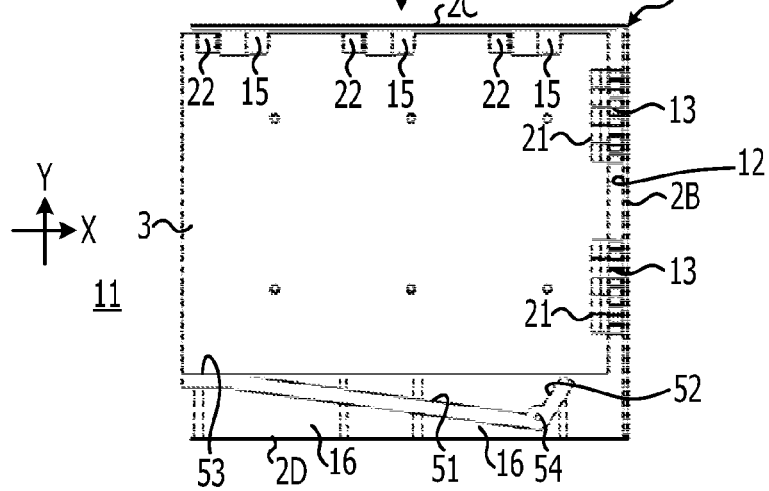

The daughter board 3a undergoes the linear movement in the X-direction while the pivotal movement of the guide portion 53 toward the first side surface portion 2C side is stopped. As illustrated in FIGS. 7E and 8C, the third connectors 21 of the daughter board 3a are engaged with the first connectors 13, and the fourth connectors 22 of the daughter board 3a are engaged with the second connectors 15. As a result, the daughter board 3a is mounted perpendicularly to the first backplane 12 and the second backplane 14.

In the second embodiment, the lever portion 52 of the lever member 50 pivots toward the second side surface portion 2D side in accordance with the linear movement of the leading end portion 3D of the daughter board 3a in the X-direction caused with a single insertion operation. The guide portion 53 of the lever member 50 pivots toward the first side surface portion 2C side as the lever portion 52 undergoes a pivotal movement. The guide portion 53 causes the daughter board 3a to undergo the parallel movement in a diagonal direction toward the first side surface portion 2C side as the guide portion 53 undergoes the pivotal movement toward the first side surface portion 2C side. By doing this, the daughter board 3a is guided to the position at which the engagement surfaces 21A of the third connectors 21 and the engagement surfaces 13A of the first connectors 13 oppose each other, and the engagement surfaces 22A of the fourth connectors 22 and the engagement surfaces 15A of the second connectors 15 oppose each other. In the electronic device 1A, the daughter board 3a is mounted perpendicularly to the first backplane 12 and the second backplane 14 by engaging the first connectors 13 with the third connectors 21 and engaging the second connectors 15 with the fourth connectors 22. As a result, in the second embodiment, a work burden in mounting the daughter board 3a perpendicularly to the first backplane 12 and the second backplane 14 may be reduced.

In the above-described first and second embodiments, the first backplane 12 and the second backplane 14 are respectively disposed on the rear surface portion 2B and the first side surface portion 2C in the housing 2 or 2a. Alternatively, for example, two backplanes may be disposed on the rear surface portion 2B and the second side surface portion 2D, on the top surface portion and the first side surface portion 2C, on the top surface portion and the second side surface portion 2D, on the bottom surface portion and the first side surface portion 2C, on the bottom surface portion and the second side surface portion 2D, or the like.

Figure 9A:
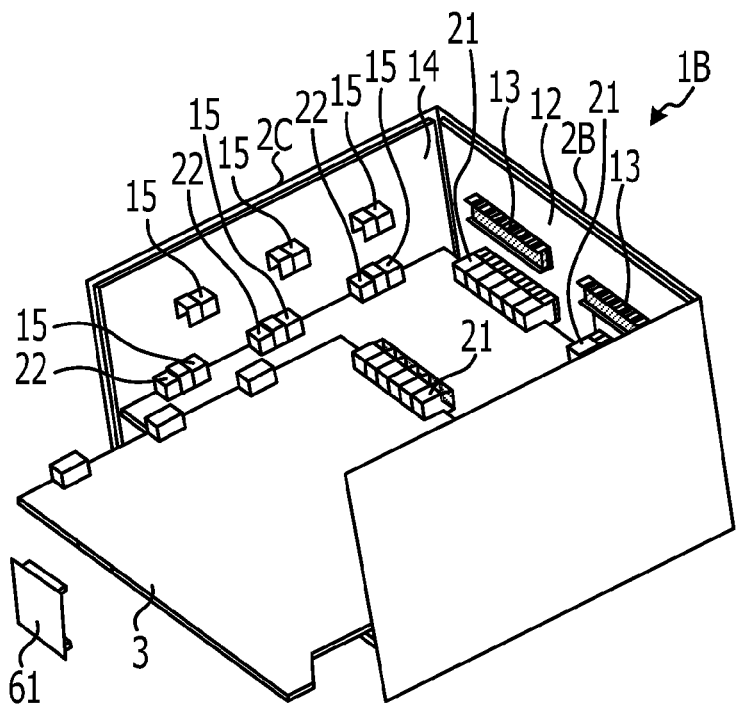
FIGS. 9A and 9B are respectively an exploded perspective view and a perspective view of an electronic device in which a plurality of daughter boards are mounted with part of the electronic device omitted.
Figure 9B:
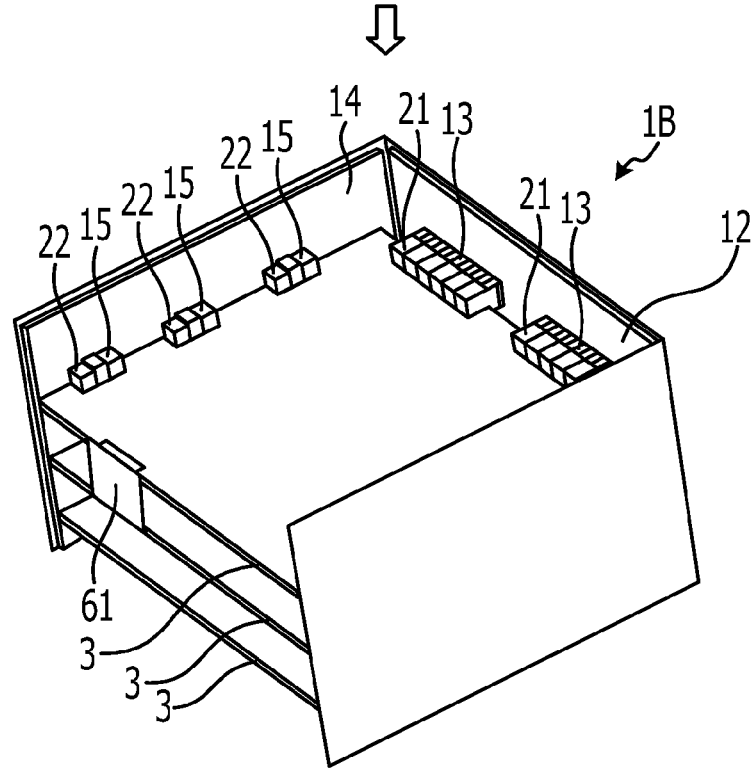

In the above-described first and second embodiments, one daughter board 3 or 3a is perpendicularly mounted to the first backplane 12 and the second backplane 14. Similar advantages are obtainable when a plurality of daughter boards 3 or 3a are mounted to the first backplane 12 and second backplane 14. FIGS. 9A and 9B are respectively an exploded perspective view and a perspective view of an electronic device 1B in which a plurality of daughter boards 3 are mounted with part of the electronic device 1B omitted. A plurality of daughter board 3a may similarly be mounted in a housing of an electronic device. For convenience of explanation, components similar to those of the electronic device 1 illustrated in FIG. 1 are denoted by the same reference signs in order to omit duplicate descriptions of structures and operations thereof. Also for convenience of explanation, the top and bottom surface portions are omitted. In addition, the second side surface portion 2D and the guide mechanism 17 are omitted from FIGS. 9A and 9B. The electronic device 1B illustrated in FIGS. 9A and 9B uses the guide mechanism 17 (not illustrated) to sequentially mount the daughter boards 3 perpendicularly to the first backplane 12 and the second backplane 14. The electronic device 1B allows the plurality of daughter boards 3 to be easily mounted to the first backplane 12 and the second backplane 14. In order to electrically connect the daughter boards 3 to each other, a jumper 61 may be used to connect the daughter boards 3 to each other.

In the above-described embodiments, when the daughter board 3 or 3a is inserted into the housing 2 or 2a, the daughter board 3 or 3a is caused to undergo the linear movement in the X-direction while occurrence of a situation in which the fourth connectors 22 interfere with the second connectors 15 is avoided, and the daughter board 3 or 3a is caused to undergo the parallel movement in a diagonal direction toward the first side surface portion 2C side. The daughter board 3 or 3a having undergone the parallel movement is again caused to undergo the linear movement in the X-direction. As a result, engagement of the third connectors 21 of the daughter board 3 or 3a with the first connectors 13 and engagement of the fourth connectors 22 of the daughter board 3 or 3a with the second connectors 15 simultaneously occur. That is, in the above-described embodiments, compared to the related-art structure in which connectors are engaged with each other by moving a daughter board in a direction perpendicular to a surface portion of the daughter board, the connectors are engaged with each other without a work space in which the daughter board 3 or 3a is moved in the perpendicular direction. As a result, in the above-described embodiments, the work space is not required, thereby allowing the size of the electronic device to be decreased by decreasing a distance between positions at which the daughter boards 3 or 3a are mounted.

In the above-described first and second embodiments, the daughter board 3 or 3a is perpendicularly mounted to the first backplane 12 and the second backplane 14. By doing this, occurrence of a situation in which connectors to be engaged with those of the daughter board 3 or 3a are concentrated in the rear surface portion 2B of the first backplane 12 is avoidable. This may decrease the number of connectors mounted on the first backplane 12 on the rear surface portion 2B side opposing the opening portion 11, and accordingly, a space in which a vent hole is disposed may be allocated in the rear surface portion 2B. As a result, cooling air flows from the opening portion 11 to the vent hole of the rear surface portion 2B in a certain direction, that is, in the X-direction, and accordingly, cooling efficiency may be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic device comprising:
   a housing including six sides at right angles to each other, a first side of the six sides including an opening;
   a first backplane arranged on a second side of the six sides and including at least one first connector, the first backplane being arranged so as to oppose to the opening;
   a second backplane arranged on a third side of the six sides and including at least one second connector, the third side being adjacent to the second side;
   a circuit board which is inserted toward the first backplane through the opening to be coupled with both of the first backplane and the second backplane with use of the first and the second connectors, the circuit board including at least one third connector to be engaged with the first connector and at least one fourth connector to be engaged with the second connector, and also including a side surface portion having a predetermined lateral dimension; and
   a guide configured to shift the circuit board a distance equal to the predetermined lateral dimension of the side surface portion in a transverse direction toward the second backplane while moving toward the first backplane while the side surface portion slides with contacting a portion of the guide, the guide being arranged on a fourth side of the six sides, the fourth side being opposed to the third side.

2. The electronic device according to claim 1, wherein the portion of the guide is formed at an angle with respect to the second backplane.

3. The electronic device according to claim 1, wherein
the second backplane includes a plurality of first connectors laid out in a direction in which the circuit board is inserted, and
the circuit board includes a plurality of second connectors, each of the plurality of first connectors becomes to face a corresponding one of the plurality of second connectors during shifting of the circuit board guided with the guide.

4. The electronic device according to claim 1, wherein the circuit board includes a protruding portion, and the protruding portion contacts the housing when the specified corner contacts the portion of the guide.

5. The electronic device according to claim 1, wherein the guide is pivotally mounted on the housing to shift the circuit board toward the second backplane with cooperative movement of an end of the guide while the other end of the guide contacts the specified corner.

6. A connection structure for a circuit board including a first connector and a second connector, the connection structure comprising:
a housing including an opening for accepting the circuit board;
a first backplane mounted on a first side of the housing and including at least one third connector, the first side being opposite to the opening;
a second backplane mounted on a second side of the housing, the second backplane including a fourth connector, the second side being adjacent to the first side; and
a guide configured to shift the circuit board a predetermined distance in a transverse direction toward the second backplane while moving toward the first backplane to couple the first connector with the fourth connector and to couple the second connector with the third connector while a corner of the circuit board slides with contacting the guide.

7. An electronic device comprising:
a housing including a side with an opening;
a first backplane mounted at a first side of the housing, the first side being opposite to the opening, the first backplane including a first connector with a first mating side opposite to the opening;
a second backplane mounted at a second side of the housing, the second side being adjacent to the first side, the second backplane including a second connector with a second mating side;
a board arranged in the housing so as to be perpendicular to the first backplane and the second backplane, the board including a third connector and a fourth connector, the third and fourth connectors configured to mate with the first and second connectors respectively; and
a guide arranged at a third side of the housing, the third side being opposite to the second side, the guide configured to shift the board a predetermined distance in a transverse direction toward the second backplane, while moving toward the first backplane, from the third side while the board is inserting in a direction from the opening to the first side with contacting the guide.

8. The electronic device according to claim 7, wherein the guide including,
a first guide groove extending in a direction from the opening to the first side, the first guide groove allowing the board to move linearly while the board is sliding along the first guide groove,
a second guide groove extending in a direction from the first guide groove to the second side, the second guide groove allowing the board to move in a direction from the third side to the second side in an oblique and parallel manner while the board is sliding along the second guide groove, and
a third guide groove extending from the second guide surface to the first side, the third guide groove allowing the board to move linearly while the board is sliding along the third guide groove.

9. The electronic device according to claim 7, wherein the guide includes a lever mounted pivotally on the third side,
wherein a front end of the lever rotates due to linear movement of the inserted board, and thereby a rear end of the lever rotates in a direction to the second side to move the board in an oblique and parallel manner in a direction from the third side to the second side.

10. The electronic device according to claim 7, wherein the board is moved to a position in which the second mating face opposes a mating face of the fourth connector.

11. The electronic device according to claim 8, wherein the board includes,
a protruding portion formed to an end surface of the board at a distance from a front end, the end surface moving slidably in contact with the guide, the distance being correspond to a length of the first guide groove, the protruding portion being formed so as to protrude toward the third side,
wherein sliding of the protruding portion in contact with the first guide groove assists a movement of the board in the direction from the third side to the second side.

12. The electronic device according to claim 7, wherein each of the second side and the third side include a guide rail so as to hold the board perpendicular to the first backplane and the second backplane.

13. The electronic device according to claim 8, wherein each of the first, second, and third guide grooves served to guide an end surface of the board.

14. The electronic device according to claim 7, wherein
the first connector and the third connector are straight type connectors which include a mating face at a front side of each of the first connectors and the third connectors, and
each of the second connector and the fourth connector are right angle type connectors which include a mating face at a side surface of each of the second connector and the fourth connector.

15. The electronic device according to claim 7, wherein the board is guided with the guide so as to move linearly in a direction from the opening to the first side while the second connector and the fourth connector have no contact with each other.

16. The electronic device according to claim 7, wherein the board is guided with the guide so as to move by a distance toward the first backplane after a shift of the board in the direction from the third side to the second side, the distance being equal to or longer than a length necessary to electrically couple the third connector with the first connector.

17. A connection structure for a circuit board, the connection structure comprising:
a housing including an opening;

a first backplane mounted on a first side opposite to the opening, the first backplane including a first connector, the first connector including a mating face opposite to the opening;

a second backplane mounted on a second side adjacent to the first side, the second backplane including a second connector, the second connector including a mating face opposite to the opening; and a guide configured to guide the circuit board a predetermined distance in a transverse direction away from a third side to the second side and toward the first side in a longitudinal direction in the housing while the circuit board is inserted in contact with the guide toward the first side, the circuit board including a third connector and a fourth connector, the third connector and the fourth connector being coupled with the first connector and the second connector, respectively.

* * * * *